(12) United States Patent
Klumel et al.

(10) Patent No.: US 12,068,190 B2
(45) Date of Patent: Aug. 20, 2024

(54) SEMICONDUCTOR FLIPPER

(71) Applicant: Yaskawa Europe Technology Ltd., Rosh HaAyin (IL)

(72) Inventors: Ran Klumel, Kfar-Saba (IL); Izia Elman, Herzliya (IL)

(73) Assignee: Yaskawa Europe Technology Ltd., Rosh HaAyin (IL)

( * ) Notice: Subject to any disclaimer, the term of this patent is extended or adjusted under 35 U.S.C. 154(b) by 324 days.

(21) Appl. No.: 17/598,430

(22) PCT Filed: Mar. 26, 2020

(86) PCT No.: PCT/IL2020/050366
§ 371 (c)(1),
(2) Date: Sep. 27, 2021

(87) PCT Pub. No.: WO2020/194310
PCT Pub. Date: Oct. 1, 2020

(65) Prior Publication Data
US 2022/0181194 A1 Jun. 9, 2022

Related U.S. Application Data (60) Provisional application No. 62/824,350, filed on Mar. 27, 2019.

(51) Int. Cl.
*H01L 21/687* (2006.01)
*H01L 21/677* (2006.01)

(52) U.S. Cl.
CPC ........ *H01L 21/68764* (2013.01); *H01L 21/67718* (2013.01); *H01L 21/68707* (2013.01)

(58) Field of Classification Search
CPC .......... H01L 21/68707; H01L 21/67718
See application file for complete search history.

(56) References Cited

U.S. PATENT DOCUMENTS

| | | | |
|---|---|---|---|
| 6,828,772 B1 | 12/2004 | Hofer et al. | |
| 10,322,513 B2* | 6/2019 | Todorov | B25J 15/0253 |
| 2003/0082042 A1 | 5/2003 | Woodruff et al. | |
| 2006/0045722 A1 | 3/2006 | Hashimoto | |
| 2006/0157998 A1* | 7/2006 | Gershenzon | H01L 21/68707 294/103.1 |

(Continued)

FOREIGN PATENT DOCUMENTS

| | | |
|---|---|---|
| JP | S63-086477 | 4/1988 |
| JP | 2008-166368 | 7/2008 |

(Continued)

OTHER PUBLICATIONS

Office Action Dated Aug. 21, 2023 From the Israel Patent Office Re. Application No. 286750. (3 Pages).

(Continued)

*Primary Examiner* — Kaitlin S Joerger (57) ABSTRACT

A wafer flipping device for use in semiconductor processing, comprises a supported rotating assembly that receives a semiconductor work product on one side when in a first unrotated position, grips and aligns the work product, rotates with the semiconductor work product thereon into a rotated position, and releases the semiconductor work product from the rotated, position. The semiconductor work product may be any one of a range of different shapes and sizes and retractable pins are selected for the corresponding shape or size.

23 Claims, 7 Drawing Sheets

(56) References Cited

U.S. PATENT DOCUMENTS

| | | | | |
|---|---|---|---|---|
| 2007/0081883 | A1* | 4/2007 | Hofmeister | ....... H01L 21/68707 |
| | | | | 414/741 |
| 2008/0156357 | A1 | 7/2008 | Mitsuyoshi | |
| 2010/0194009 | A1 | 8/2010 | Fullwood et al. | |
| 2012/0037475 | A1 | 2/2012 | Baccini et al. | |
| 2012/0128457 | A1 | 5/2012 | Chang et al. | |
| 2013/0011225 | A1* | 1/2013 | Goodman | ......... H01L 21/68785 |
| | | | | 414/225.01 |
| 2017/0243735 | A1* | 8/2017 | Kaba | ....................... H01L 21/67 |
| 2018/0281204 | A1 | 10/2018 | Fromm et al. | |
| 2022/0181194 | A1* | 6/2022 | Klumel | ............. H01L 21/67718 |

FOREIGN PATENT DOCUMENTS

| | | |
|---|---|---|
| JP | 2008-198879 | 8/2008 |
| WO | WO 2020/194310 | 10/2020 |

OTHER PUBLICATIONS

Supplementary European Search Report and the European Search Opinion Dated Oct. 26, 2022 From the European Patent Office Re. Application No. 20777281.5. (4 pages).

International Preliminary Report on Patentability Dated Oct. 7, 2021 From the International Bureau of WIPO Re. Application No. PCT/IL2020/050366. (6 Pages).

Communication Pursuant to Article 94(3) EPC Dated Apr. 11, 2023 From the European Patent Office Re. Application No. 20777281.5 (4 Pages).

International Search Report and the Written Opinion Dated Jun. 29, 2020 From the International Searching Authority Re. Application No. PCT/IL2020/050366. (11 Pages).

Notice of Reason(s) for Rejection Dated Apr. 16, 2024 From the Japan Patent Office Re. Application No. 2021-555805 and Its Translation Into English. (9 Pages).

* cited by examiner

SEMICONDUCTOR FLIPPER

RELATED APPLICATIONS

This application is a National Phase of PCT Patent Application No. PCT/IL2020/050366 having International filing date of Mar. 26, 2020, which claims the benefit of priority under 35 USC § 119(e) of U.S. Provisional Patent Application No. 62/824,350 filed on Mar. 27, 2019. The contents of the above applications are all incorporated by reference as if fully set forth herein in their entirety.

FIELD AND BACKGROUND OF THE INVENTION

The present invention, in some embodiments thereof, relates to a semiconductor flipper. The flipper is a device used in the semiconductor fabrication industry, and its function is to flip wafers and ring frames, typically by 180 degrees so that components can be etched or otherwise manufactured on the reverse side. Flippers are installed inside a mini-environment within the equipment front end module (EFEM). The EFEM is a feature of semiconductor automation, shuffling the silicon wafer or quartz photo-mask between ultra-clean storage carriers and a variety of processing, measurement and testing systems. The EFEM contains components needed to unload the wafer, deliver the wafer to a parent tool for processing and return the product to its carrier upon completion.

EFEMs were developed in response to the demand for higher yields and throughput, which have been further driven by ever-shrinking geometries in integrated circuit production. As features get smaller and smaller, contamination levels that were acceptable previously have become intolerable.

In semiconductor machining, contamination is thus one issue and a second is ever higher resolution and accuracy, which requires accurate alignment. By automating the process, it is possible to both improve alignment and remove that contamination which is associated with product handling by an operator. In such an automated process, a human operator cannot simply pick up a wafer and turn it over in order to machine the opposite side.

Accordingly, the semiconductor industry has driven equipment standards to guarantee commonality of physical design, product handling strategies, communications interfacing and operator controls between different equipment manufacturers. One benefit of standardization is the development of bolt-on modules, such as off-the-shelf EFEMs, which can be quickly and easily attached to a tool and operate as slave devices under the control of a factory host or parent tool.

In use, silicon wafers and ring frames are stacked inside the EFEM in a load port, from where a robot picks an individual wafer or ring frame (referred to in this document as "media" or as "semiconductor work products") and transfers the media into the fabrication process.

Within the fabrication process, media sometimes need to be flipped, typically by 180 degrees, in order to address the increasing demand for wafer backside processing or inspection. This action is done by devices such as a flipper.

The robot places the media inside the flipper, the flipper grips the media and the rotating assembly rotates to flip it by 180 degrees. It then releases its grip, leaving the media lying free and the robotic arm can then re-enter the flipper, take hold of the flipped media, remove it from the flipper and place it in the fabrication process. For each wafer type, the Place and Pick points, point at which the robot places the wafer and then picks it after being flipped, are the same teaching point, meaning that the robot needs to be programmed only once for each wafer size.

Additional background art includes TWM429985(U) Apparatus for Holding a Wafer, WO2015127191 System and method for bi-facial processing of substrates, US8529314 Method of Transporting Work and Apparatus with Work Handover Mechanism, EP1884982 Semiconductor wafer mount apparatus, US2009092469(A1)—Substrate processing unit, substrate transfer method, substrate cleansing process unit, and substrate plating apparatus, U.S. Pat. No. 9,378,997 (B2)—Substrate holding mechanism, substrate transporting device, and semiconductor manufacturing apparatus, KR20080072272(A)—Apparatus for carrying substrate, KR100888045(B1)—Apparatus for inverting a substrate, U.S. Pat. No. 5,160,961(A)—Substrate holding device, U.S. Pat. No. 8,863,808(B2)—Pair of substrate holders, substrate holder, substrate bonding apparatus and method for manufacturing device, U.S. Pat. No. 6,828,772 (B1)—Rotating gripper wafer flipper, US2004145199 (A1)—Apparatus, system, and method for gripping and holding disk-shaped objects, and U.S. Pat. No. 6,520,315 (B1)—Gripper assembly.

Existing flippers may support one type of medium only. To change medium, the EFEM must be stopped and the flipper must be replaced.

Existing flippers use multiple, cumbersome pneumatic tubing to drive the moving parts on the rotating assembly. Each tube requires a rotary joint of its own.

Electrical wiring harnesses for powering the moving parts on the rotating assembly contain a large number of wires, all of which require a means of transiting from the flipper main body to the rotating assembly.

The multiplicity of components, tubes and wires increases the potential for failures, yet the flipper is only required to make a half rotation, so that no need for more elaborate solutions is recognized.

Existing flippers take only a single size of medium, which is placed by a robot in a position clearly defined by the geometry of the flipper. As soon as multiple sizes and shapes of media are to be catered for, there arises a need to provide registration of the medium on the flipper, irrespective of the size to the high levels of positioning accuracy needed by the semiconductor industry. That is to say it is difficult to position the media accurately within the rotating assembly. In addition, every additional component increases the complexity of both the tubing and wiring.

SUMMARY OF THE INVENTION

The present embodiments seek to overcome the above limitations by providing a flipper having a gripper and multiple sets of alignment pins to accommodate different sizes and shapes of semiconductor work product, each set of alignment pins providing alignment against a plunger for a defined size or shape of medium. The gripper is designed so that only the appropriate set of alignment pins is engaged for each size or shape of medium. The flipper may therefore accommodate a range of different sizes, thicknesses and shapes of media, and the gripper, combined with the plunger and the appropriate set of alignment pins may provide accurate alignment in all cases.

A further advantage is that the precision and complexity required from the robot arm is reduced since the media may be provided already in alignment. The flipper of the present embodiments may control and power as many components as necessary without notably increasing the connection complexity.

In certain embodiments, a single air/vacuum supply and/or a slip ring, both extending through a rotation axis of the flipper, may be used to provide electrical and pneumatic power to the flipper so as to place and operate valves and sensors on the rotating part. This not only reduces the number of points of failure, but removes one of the main limitations on the number of on-board components.

In other embodiments, multiple wires may be connected to the flipper through a cord, as is well-known in robot arms and like technologies.

The reduction in the mechanical and electrical complexity of the flipper may increase the mean time between failures.

According to an aspect of some embodiments of the present invention there is provided a wafer flipping method for use in semiconductor processing of semiconductor work products of a plurality of predetermined sizes, the method comprising:

receiving a semiconductor work product of a first predetermined size in a rotating assembly when in a first unrotated position, the rotating assembly having a plurality of retractable pins each corresponding to a respective predetermined size;

gripping the semiconductor work product in the assembly at a first rotation position;

selecting retractable pin from the plurality of alignment retractable corresponding to the first predetermined size;

aligning the semiconductor work product in the assembly using the selected retractable pin;

rotating the assembly with the semiconductor work product thereon into a second, rotated, position;

releasing the semiconductor work product from the second, rotated, position.

The method may comprise gripping the semiconductor work product between a first gripping frame and a second gripping frame.

The method may comprise receiving pneumatic power from a support into the rotating assembly and supplying the pneumatic power to the gripper.

The method may comprise using a rotary joint with respective feed and return connections to provide a pneumatic circuit.

The method may comprise using a slip ring for supplying electrical power from a support to the assembly.

The method may comprise pushing the semiconductor work product using a plunger pin against respective extended alignment pins of the retractable pins to align the work product.

The method may comprise operating the alignment pins via solenoids.

In an embodiment, the solenoids are powered through a slip ring from at least one electronic controller mounted outside the rotating assembly.

In an embodiment, the second position is rotated by up to a hundred and eighty degrees from the first position.

In an embodiment, the semiconductor work product is a wafer or a ring.

The method may comprise operating a release actuator for releasing the semiconductor work product from the gripper when in the second rotated position, the semiconductor work product thereby being released in a predetermined alignment at the second rotated position.

According to a second aspect of embodiments of the present invention there is provided a wafer flipping device for use in semiconductor processing of semiconductor work products of a plurality of different predetermined sizes, the device comprising a supported rotating assembly, the rotating assembly comprising:

a gripper for receiving the semiconductor work product;

upper and lower frame parts for gripping the semiconductor work product within the frame while the semiconductor work products is oriented in a first orientation;

retractable pins for bringing the semiconductor work product into a predetermined alignment within the frame, the retractable pins being selectable for different ones of the predetermined sizes, thereby to provide alignments for all of the predetermined sizes;

a rotation actuator for rotating the rotating assembly between the first orientation and a second orientation rotated from the first orientation; and a release actuator for releasing the frame parts to release the semiconductor work product into a predetermined alignment when in the second orientation.

In embodiments, the rotating assembly comprises a rotary joint for receiving pneumatic power from a support for supply to each of the frame parts.

In embodiments, the rotary joint is located on a rotation axis of the rotating assembly.

In embodiments, the rotating assembly comprises a slip ring for supplying electrical power from a support to the assembly.

In embodiments, alignment pins of the retractable pins are for aligning semiconductor work products of respective ones of a plurality of different sizes or shapes, each size or shape having a respective predetermined alignment.

In embodiments, the alignment pins are operated via at least one electronic controller mounted outside the rotating assembly. Additionally, or alternatively, the frame parts are operated via at least one electronic controller mounted outside the rotating assembly.

In embodiments, the at least one electronic controller is connected to power the alignment pins or the frame parts.

In embodiments, the alignment pins or the frame parts are powered via a slip-ring.

In embodiments, the retractable pins are provided in pairs, and at least one of each pair of the alignment pins comprises an alignment pin.

Embodiments may comprise a pneumatic distribution system for distributing pneumatic fluid from the rotary valve to respective ones of the gripper frame parts.

In embodiments, the second orientation is rotated by a hundred and eighty degrees from the first orientation.

In embodiments, the semiconductor work product is a wafer or a ring.

According to a third aspect of embodiments of the present invention there is provided a wafer flipping device for use in semiconductor processing, comprising a support comprising an electrical power supply and a pneumatic source;

a rotating assembly;

a slip ring connecting the power supply to the rotating assembly; and a rotary joint configured to mount the rotating assembly on the support and to provide a feed and return to connect the pneumatic source to the rotating assembly.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to a semiconductor flipper and, more particularly, but not exclusively, to a flipper for use with an EFEM.

A wafer flipping device for use in semiconductor processing, comprises a supported rotating assembly that receive a semiconductor work product on one side when in a first unrotated position, grips, places and aligns the work product, rotates with the semiconductor work product thereon into a rotated position, and releases the semiconductor work product from the rotated position in a predetermined alignment. The predetermined alignment may differ for different sizes and shapes of work product. Rotation is typically over 180 degrees, hence the term "flip".

Modern semiconductor plants require the ability to place components on both sides of a semiconductor wafer. Thus the wafer needs to be flipped over at some point.

Flipping devices in the prior art are rotating plates of a given size that can accommodate a single size of wafer which is placed on the plate by a robot arm. Each device is specific to ring frames or wafers and to a given size. The robot arm positions the wafer which is then gripped by the plate using pneumatically powered gripping pieces. Each gripping piece is controlled separately by a different air pipe.

The flipper of the present embodiments may by contrast accommodate both ring and wafer types of media and may accommodate different sizes. In the prior art the machinery must be stopped and the flipper replaced to change size or type of medium.

The medium is gripped by a gripper, made up of lower and upper gripping frames, and sets, typically pairs of alignment pads, made up of a placement pad and at least one alignment pin per pair may be used for edge-on engagement of the medium to define a price position for the medium. The gripper and the alignment pads are located on the flipper itself and may be powered through a pneumatic circuit from an air supply. The air supply passes to the rotating assembly through a rotating joint, exhaust by return, and electrical power may be provided through a slip ring. Vacuum may be used. The gripping electro pneumatics circuitry and mechanical features are located on the rotating assembly itself. The gripper frames move simultaneously towards and away from each other, typically in response to a grip or ungrip command.

The flipper includes a plunger to push against the semiconductor work product from one edge and the placement pads may include alignment pins to align the semiconductor work product accurately on the flipper by engaging with facing edges. The plunger pushes the medium against the alignment pins. Prior art flippers do not provide alignment, and the robot receiving the flipped over wafer has to consider the wafer to be unaligned. The robot in the prior art may thus take the responsibility for realigning the wafer, rendering the robot more complex and expensive.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1:
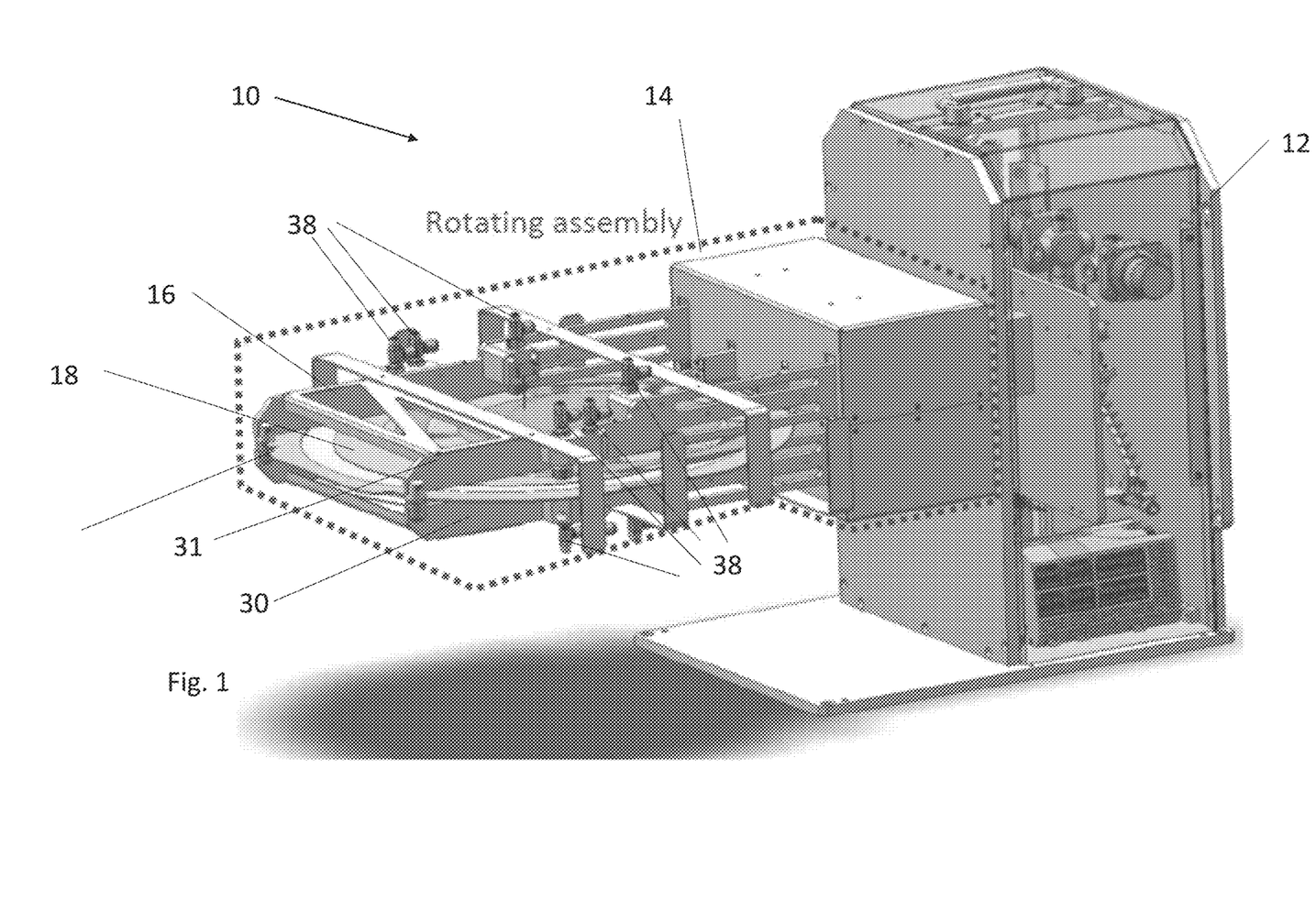
FIG. 1 is a perspective view of a semiconductor flipper device according to embodiments of the present invention.

Referring now to the drawings, FIG. 1 illustrates a wafer flipping device 10 for use in semiconductor processing. The wafer flipping device includes a support 12 and a rotating assembly 14. The rotating assembly includes an assembly 16 which is designed to receive and grip semiconductor products for flipping.

Figure 2:
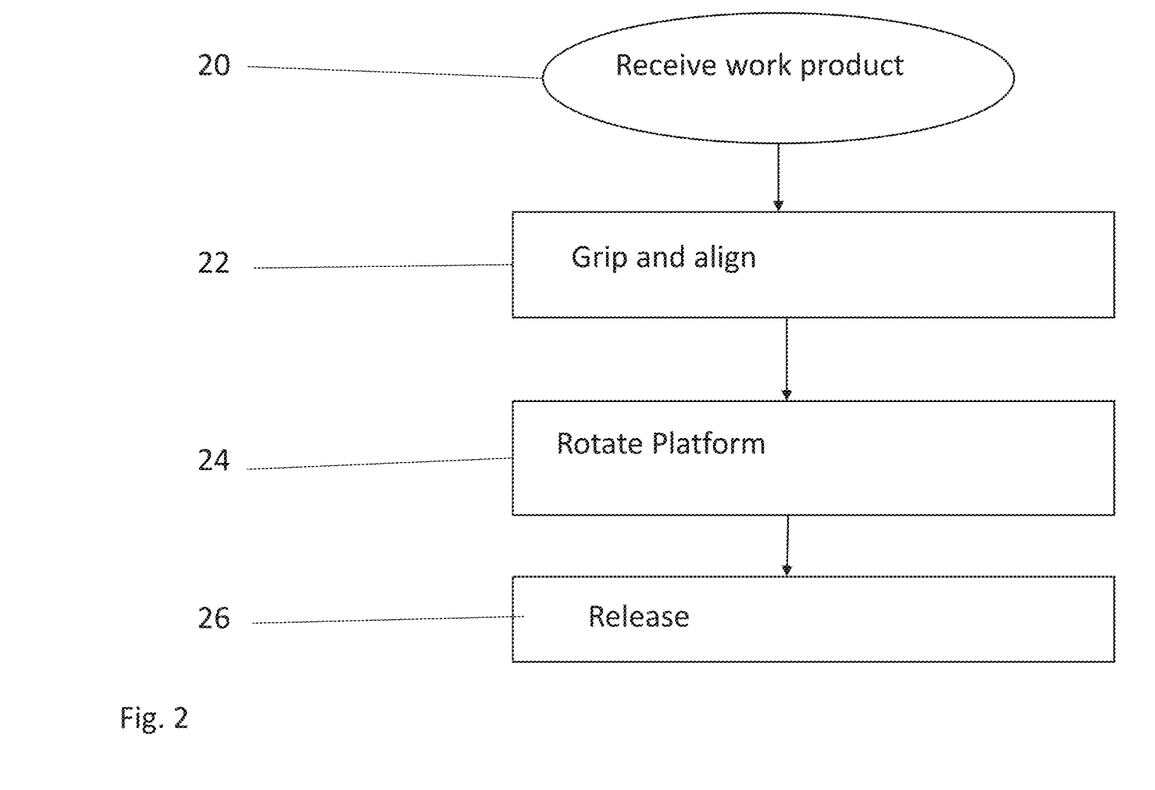
FIG. 2 is a simplified flow chart of operation of the flipper device of FIG. 1.

The rotating assembly 16 is designed to receive a semiconductor work product or medium 18 on the frame surface prior to rotation, and its operation is schematically shown in FIG. 2. The assembly receives 20 the work product, typically from a robot arm, and a plunger pushes the edges of the work product against alignment pins in a way that ensures alignment of the work product to a defined position on the assembly. A gripper then grips 22 the work product in the aligned position. Then, as the work product is firmly gripped, the assembly rotates 24 so that the work product is now facing the opposite way on the underside of the assembly. The work product may then be released 26, typically again to a robot arm for returning in inverted form to the semiconductor production process.

In greater detail, operation of the flipper is as follows:
1. A starting precondition is for the flipper to be at 0°. The grip is open, and no work product is detected in the flipper.
2. The host configures the wafer size, say via digital 110 or serial communication interface.
3. The flipper raises a set of pin valves chosen for the size or shape of the work product, thus extending the appropriate set of alignment pins as appropriate, the alignment pins being on placement pads.
4. A robot arm puts the work product on the flipper.
5. Alignment—a plunger then pushes the work product against the raised alignment pins.
6. The plunger may be retracted. In variations, the plunger may be retracted later, after the flipper procedure.
7. The grip is closed.
8. The flipper Rotates.

9. Finally, the grip is opened to release a rotated and aligned work product, where the alignment may be specific to the particular size and shape of the work product.

Returning now to FIG. 1, and the rotating assembly 16 has a gripper made up of lower frame part 30 and upper frame part 31, whose task is to grip the semiconductor work product 18 when placed on the assembly. The work product 18 may reach different radiuses around the center of the assembly, and the assembly is intended to accommodate work products of different sizes and shapes, including wafers of several different sizes and rings of several different sizes. The gripper may be pneumatic. The gripper may be provided with upper 31 and lower 30 gripper frame parts. Retractable pins 38 are located at various radiuses to securely position work products of different sizes so that any work product in a list of predefined sizes can be accurately aligned.

Figure 7:
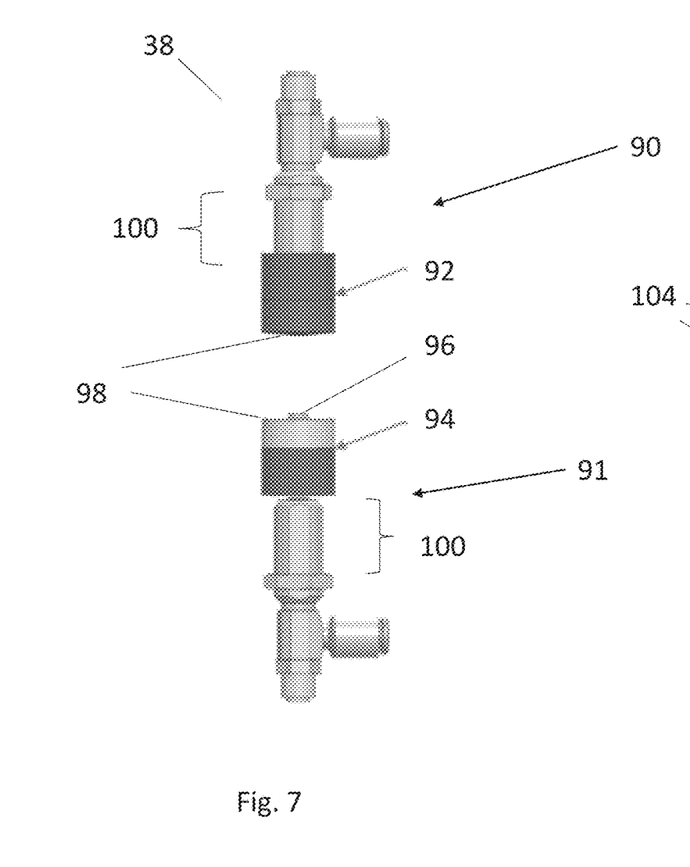
FIG. 7 is a detail of a pair of the retractable pins of FIG. 1.

As shown in FIG. 7, the retractable pins 38 come in pairs 90. Each pair includes an upper retractable pin 90 and a lower retractable pin 91. Upper retractable pin 90 may include upper placement pad 92. The lower retractable pin 91 includes placement pad 94 and alignment pin 96. Alignment pin 96 may form a retractable structure and provide a precise alignment for the semiconductor work product.

Figure 8:
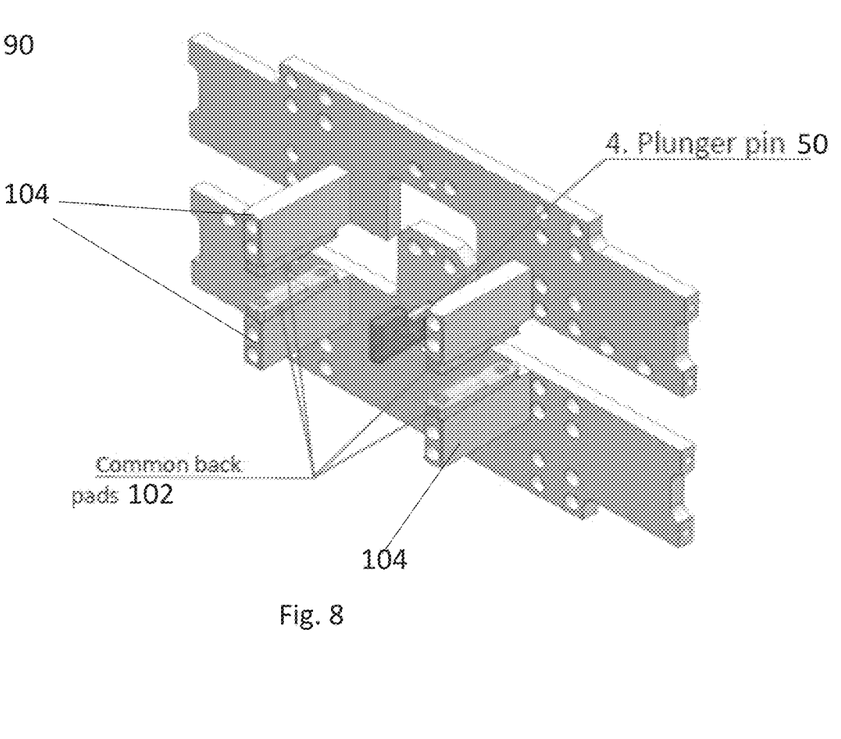
FIG. 8 is a detail of the back plate of FIG. 1.

At least some of the media types may require at least two pairs of placement pads, and in an embodiment, one of the two sets is retractable. The retractable sets are retracted when their corresponding media type is not present. Placement pad 98 is located on the surface of the pin against the work product and is moved up and down on actuated section 100. As well as the placement pads 98 with the alignment pins, there are further placement pads 102 that provide common back pads 104 as shown in FIG. 8 that are common to all the media types. The back pads are on the back plate of the rotating assembly that is held against a support. Plunger 50 has a pin that provides horizontal alignment of the semiconductor work product and pushes the work product against the alignment pins 96.

Figure 3:
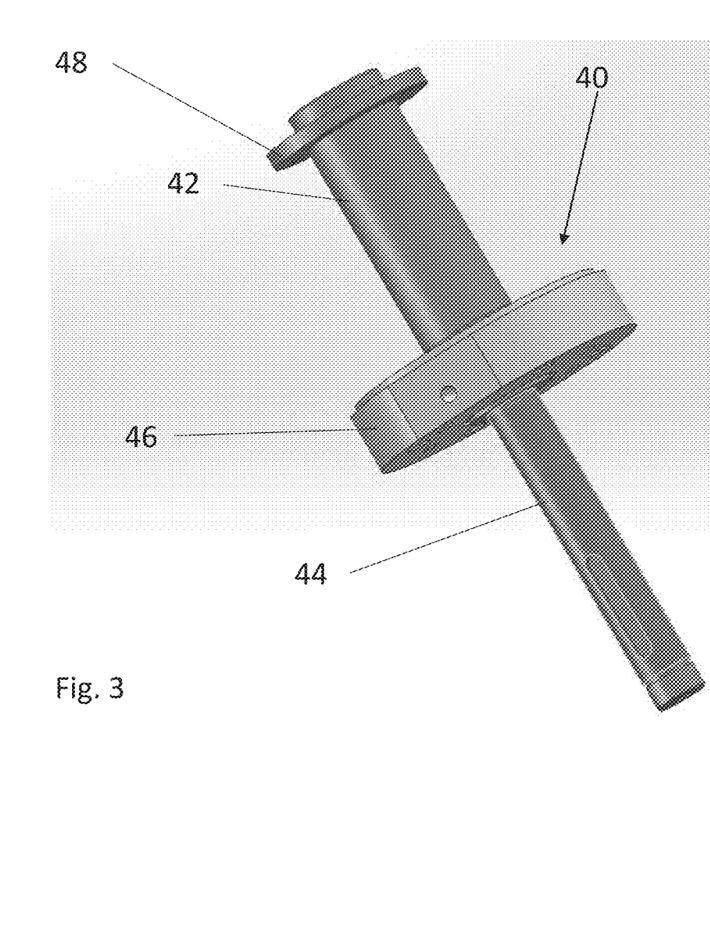
FIG. 3 is a perspective view of a rotary joint to connect the rotating assembly of FIG. 1 with a support.

Referring now to FIG. 3, and in certain embodiments, a rotary joint 40 connects the assembly to the support via flange 46. Extension 44 is on the support side and provides a location for the main rotary actuator and for the electrical slip ring. Extension 48 extends into the rotating assembly, with a connection to the support structure 46 and connection 48 to the rotating structure. Thus the rotating assembly may be held axially in position against the structure of the support. The rotary joint allows the assembly to rotate about the central axis of the joint and further receives pneumatic power from the pneumatic circuit in the support for supply to the rotating assembly 14 and separately to frame parts 30, 31, gripper, plunger on the rotating assembly 14 that is in contact with the product. Pneumatic power is, in this embodiment, centrally supplied from a single rotary joint at the axis of rotation where the rotating assembly joins the support. In other embodiments, pneumatic power may be supplied via a flexible tube outside of the rotating axis.

Figure 4:
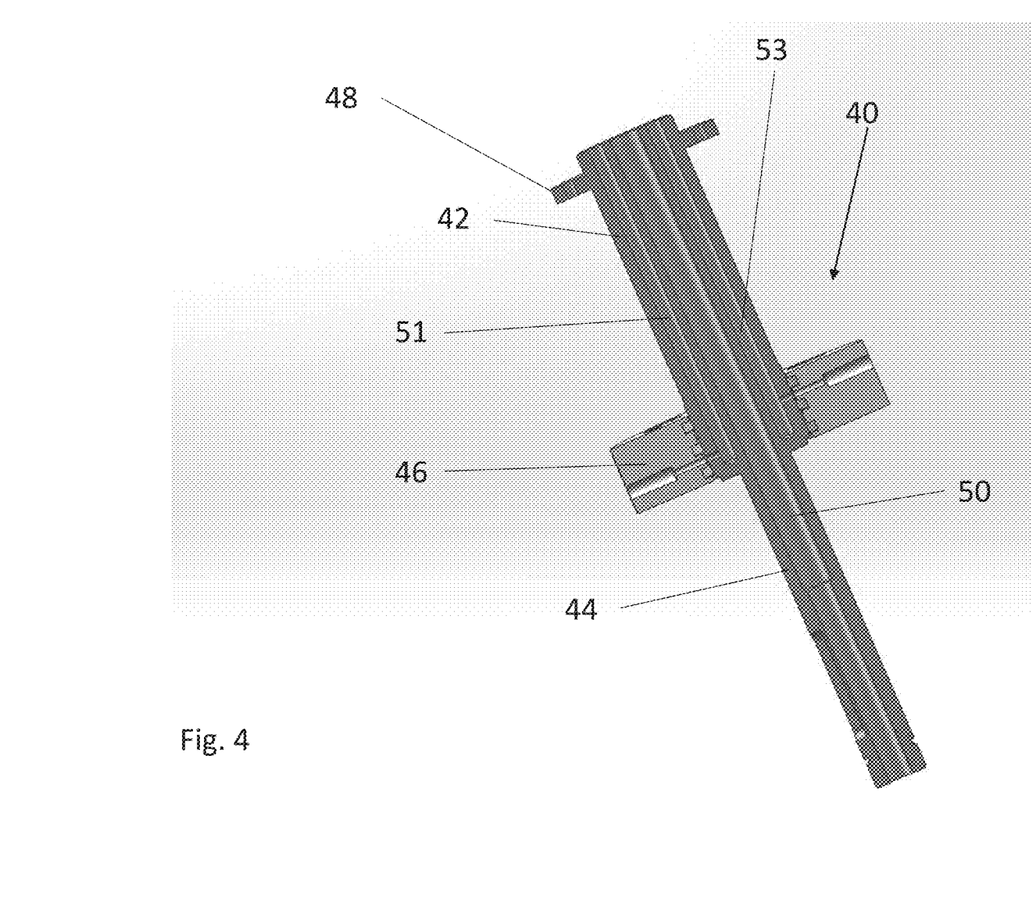
FIG. 4 is a cross-sectional view of the rotary joint of FIG. 3.

Reference is now made to FIG. 4, which is a simplified schematic drawing of a longitudinal cross-section of the rotary joint 40 of FIG. 3. Central pipe 50 is along the axis of rotation and thus rotates without changing position. Central pipe 50 contains electrical cables from the slip ring. Pipes 51 and 53, on either side of central pipe 50, carry the forward and return air respectively. The assembly rotates using the rotary joint and the internal hollow of the pipe continues to supply pneumatic power along the rotation axis as the assembly rotates.

The rotating assembly may also require electrical power for on-board systems such as rotation control systems, alignment control systems and actuators. A single slip ring connection around the joint may be used to supply the assembly systems from the support. For example, a 24 wire slip ring may be used. Alternatively, the wires could be connected directly without a slip ring, since rotation does not generally exceed 180 degrees. Individual wires may be connected directly or the wires may be connected together in a tube. In addition, pneumatic tubes may be connected, with or without tunnels.

Figure 5:
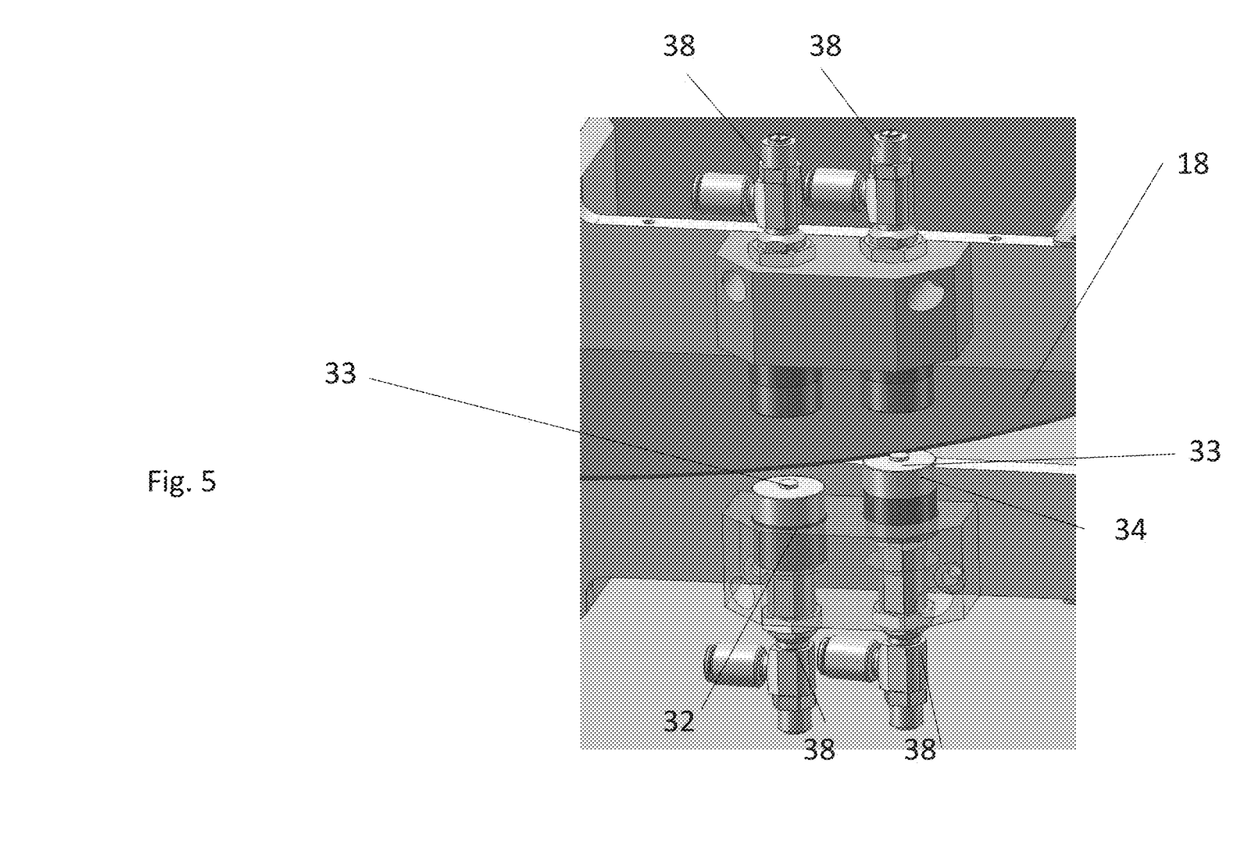
FIG. 5 is a view of retracted and extended alignment pins for use in the embodiment of FIG. 1.

Reference is now made to FIG. 5, which is a detail of FIG. 1 showing an upper and lower pair of retractable pins 38 for placing a work product 18. The retractable pin comprises a pneumatic piston together with a placement pad and an alignment pin 33. The retractable pins 38 may be raised or lowered to and/or may extend alignment pins 33, depending on whether they are at the radius specified for the current work product. There are multiple retractable pins at different locations to provide alignments for different media sizes and shapes, thus for example inner and outer retractable pins 32 and 34 are at two close but different radiuses. Retractable pad 34 is extended upwards for alignment as it is at the correct radius for the current media 18.

A programmable Logic Controller (PLC) may be mounted in the static part of the Flipper. Control and status signals are passed from/to the PLC via the slip ring. Pneumatic pistons are placed to operate the retractable pins, and the gripper and the plunger.

In FIG. 7, the retractable pin 91 is the whole structure formed by the pneumatic piston and an alignment pad, where the alignment pad is made up of the placement pad and alignment pin.

In order to prepare the flipper for a specific media type, the processor provides a command to the appropriate electric valves to extend the pneumatic pistons that relate to alignment pads and pins of the given media type, the remaining pistons do not operate. As a result, the appropriate pneumatic pistons raise their corresponding alignment pads.

An alignment pin is a part of the alignment mechanism. When the media is placed on the placement pads, alignment takes place. The alignment starts when the plunger pin 50 pushes the media until it reaches and is stopped by the extended alignment pins 96.

Thus the alignment pin is a component that forms a part of the alignment procedure, and allows alignment to be carried out.

Once the work product is received in the assembly, the product is then aligned by pushing with a plunger against the exposed alignment pins, and gripped by the gripper. Then the assembly rotates, typically by a hundred and eighty degrees from the initial position. Rotation may be carried out by a rotation actuator which is typically mounted in the support. Following the rotation, the work product may be released from the gripper into a robot arm for replacing into the semiconductor manufacturing facility. The gripper may include actuators to operate the pneumatics and grip and release the work products. As the work product is already aligned, the robot arm does not need alignment abilities and thus a cheaper robot arm may be used.

The semiconductor work product may be a wafer or a ring frame that is worked on both sides.

In greater detail, a flipper device according to the present embodiments may be used in the semiconductor fabrication industry to flip silicon wafers and ring frames, also referred to as Film Frames for Post-Dicing.

Silicon wafers and ring frames may be stacked inside a cassette placed in a load port, from where a robot picks an individual wafer or ring frame, referred to herein as the semiconductor work product, and transfers it into the fabrication process.

Within the fabrication process, the work product sometimes need to be flipped, typically by 180 degrees, in order to address the increasing demand for wafer backside process or inspection and the present embodiments provide a device for this purpose.

The robot places the media inside the flipper, the flipper grips the media and the rotating assembly rotates, to flip the semiconductor work product by 180 degrees. The flipper then releases its grip, leaving the work product lying free and the robotic arm may then re-enter the flipper, take hold of the flipped work product, remove it from the flipper and place it in the fabrication process. Placement pads with associated alignment pins ensure that each wafer type has its own alignment on the flipper. Hence the Place and Pick points, at which the robot places the wafer and then picks it after being flipped, are the same teaching point, meaning that the robot needs to be programmed only once for each wafer size.

The following are four features of the flipper of the present embodiments.
1. The flipper accommodates multiple work product types, including wafer and ring configurations.
2. The flipper accommodates different work product sizes.
3. The retractable pads are located and powered directly on the rotating gripper.
4. Alignment pins and a plunger position the work product precisely within the flipper, each different size and shape having a specific alignment and set of retractable pins and a gripper.

The flipper of the present embodiments thus does not need to be retooled, replaced, or handled in any way in order to accommodate different work product shapes and sizes.

By contrast, in the prior art, flippers generally support one type of medium only. To change medium, the EFEM must be stopped and the flipper must be replaced. The flipper of the present embodiments can handle multiple shapes and sizes while avoiding the need to stop the EFEM to replace the flipper.

An exemplary wafer according to the present embodiments may be designed to support four different sizes of media:
1. 200 mm diameter (wafers types)
2. 300 mm diameter (wafers types)
3. Ring Frame for 200 mm wafers types
4. Ring Frame for 300 mm wafers types The flipper of the present embodiments may have just one pair of pneumatic tubes, that is a single feed tube and a single return tube, and a slip ring with multiple wires, for example 24 wires, may be used to operate all valves which are placed on the rotating assembly. All of the control mechanics and circuitry may be installed directly on the rotating assembly, minimizing the potential for failures.

In the prior art, flippers do not control the positioning of the semiconductor work product inside the rotating assembly. They depend on the placement of the media by the robot.

Figure 6:
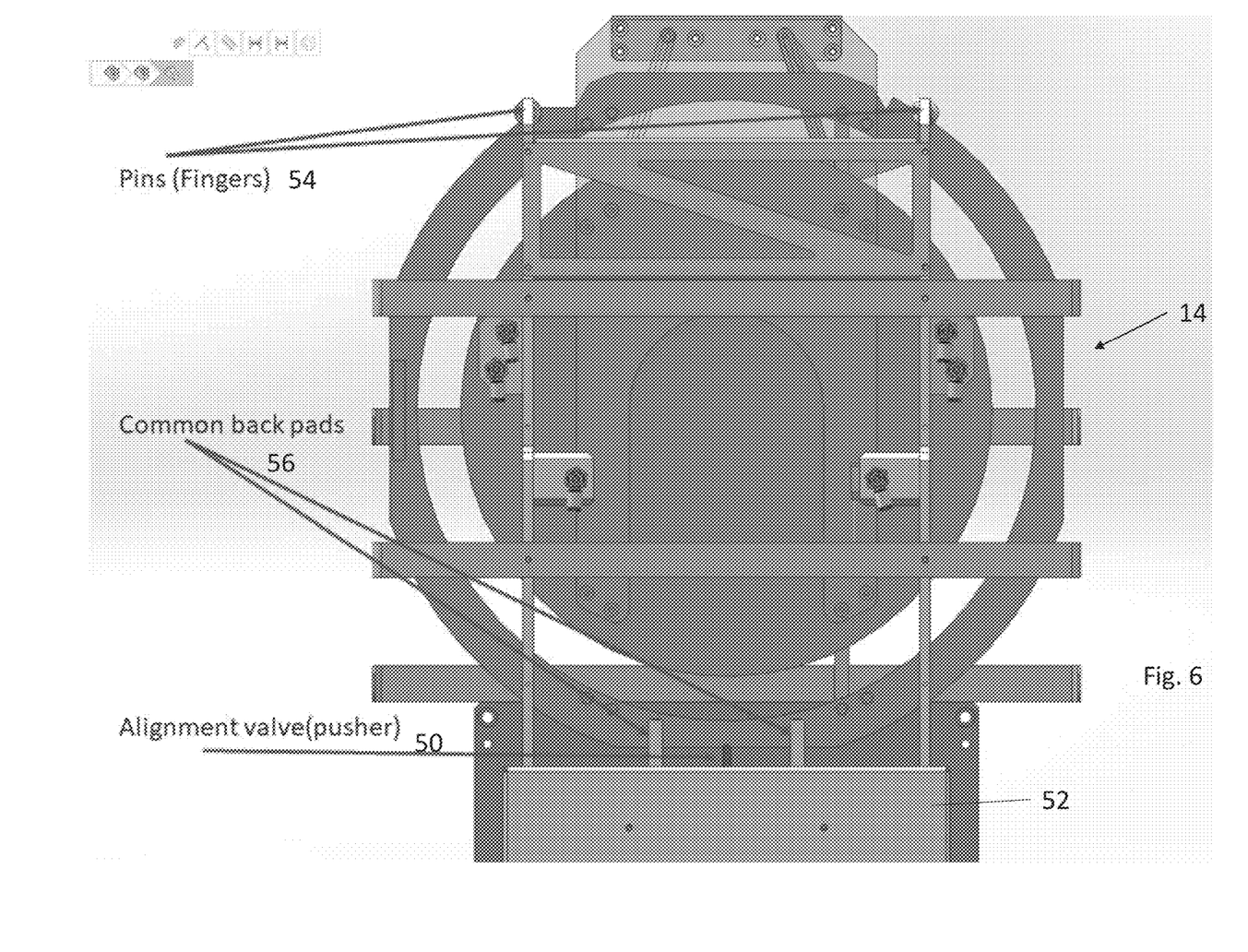
FIG. 6 is a plan view of the rotating assembly of FIG. 1.

Reference is now made to FIG. 6, which is a view from above of the rotating assembly 14. The flipper of the present embodiments may accurately position the work product within the rotating assembly to assure safe rotation, minimizing the risk of a mispositioned work product breaking free while being rotated.

Furthermore, the wafer position alignment feature of the present embodiments allows the use of Vacuum End Effectors and eliminates the need for Edge Grip End Effectors.

The work product, once placed inside a flipper 10 according to the present embodiments, may be positioned precisely in place with the help of an alignment plunger 50, to push the work product into place. At the same time, placement pads with alignment pins as explained above, serve as stoppers for the work product being pushed by the pusher. When the work product reaches the currently selected alignment pins, the plunger stops but retains its pressure on the work product, positioning it precisely in place.

Each wafer size may be placed on common back pads 56 and may have dedicated retractable pins, typically two pairs of dedicated retractable pins, one pair to the right and one pair to the left. The flipper selects the two pairs of pins, left top/bottom and right top/bottom, to be raised according to work product size and shape information from the host to provide alignment. In embodiments, sensors on the flipper may detect the media size and/or type. All other pads for other sizes and shapes may be retracted as necessary, it being noted that the pads for the largest size never need to be retracted as they never cause an obstruction.

It is noted that the flipper may be used simply to align the wafer without actual flipping. The robot may take an unaligned work product from a cassette, place it in the flipper for alignment and then provide an aligned wafer to the process.

It is expected that during the life of a patent maturing from this application many relevant EFEM devices and wafer production technology will be developed and the scopes of the corresponding terms are intended to include all such new technologies a priori.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A wafer flipping method for use in semiconductor processing of semiconductor work products of a plurality of predetermined sizes, the method comprising:
   receiving a semiconductor work product of a first predetermined size in a rotating assembly when in a first unrotated position, the rotating assembly having a plurality of retractable pins each corresponding to a respective predetermined size;
   gripping the semiconductor work product in the assembly at a first rotation position;
   selecting retractable pin from the plurality of alignment retractable corresponding to said first predetermined size;
   aligning the semiconductor work product in the assembly using said selected retractable pin;
   rotating the assembly with the semiconductor work product thereon into a second, rotated, position;
   releasing the semiconductor work product from said second, rotated, position.

2. The wafer flipping method of claim 1, comprising gripping said semiconductor work product between a first gripping frame and a second gripping frame.

3. The wafer flipping method of claim 1, comprising receiving pneumatic power from a support into said rotating assembly and supplying said pneumatic power to said gripper.

4. The wafer flipping method of claim 3, comprising using a rotary joint with respective feed and return connections to provide a pneumatic circuit.

5. The wafer flipping method of claim 1, comprising using a slip ring for supplying electrical power from a support to said assembly.

6. The wafer flipping method of claim 1, comprising pushing the semiconductor work product using a plunger pin against respective extended alignment pins of said retractable pins to align said work product.

7. The wafer flipping method of claim 6, comprising operating said alignment pins via solenoids.

8. The wafer flipping method of claim 7, wherein the solenoids are powered through a slip ring from at least one electronic controller mounted outside said rotating assembly.

9. The wafer flipping method of claim 1, wherein said second position is rotated by up to a hundred and eighty degrees from said first position.

10. The wafer flipping method of claim 1, wherein the semiconductor work product is a wafer or a ring.

11. The wafer flipping method of claim 1, comprising operating a release actuator for releasing said semiconductor work product from said gripper when in said second rotated position, said semiconductor work product thereby being released in a predetermined alignment at said second rotated position.

12. A wafer flipping device for use in semiconductor processing of semiconductor work products of a plurality of different predetermined sizes, the device comprising a supported rotating assembly, the rotating assembly comprising:
   a gripper for receiving said semiconductor work product;
   upper and lower frame parts for gripping said semiconductor work product within said frame while said semiconductor work products is oriented in a first orientation;
   retractable pins for bringing the semiconductor work product into a predetermined alignment within said frame, the retractable pins being selectable for different ones of said predetermined sizes, thereby to provide alignments for all of said predetermined sizes;
   a rotation actuator for rotating said rotating assembly between said first orientation and a second orientation rotated from said first orientation; and
   a release actuator for releasing said frame parts to release said semiconductor work product into a predetermined alignment when in said second orientation.

13. The wafer flipping device of claim 12, wherein said rotating assembly comprises a rotary joint for receiving pneumatic power from a support for supply to each of said frame parts.

14. The wafer flipping device of claim 13, wherein said rotary joint is located on a rotation axis of said rotating assembly.

15. The wafer flipping device of claim 12, wherein said rotating assembly comprises a slip ring for supplying electrical power from a support to said assembly.

16. The wafer flipping device of claim 12, wherein alignment pins of said retractable pins are for aligning semiconductor work products of respective ones of a plurality of different sizes or shapes, each size or shape having a respective predetermined alignment.

17. The wafer flipping device of claim 16, wherein said alignment pins are operated via at least one electronic controller mounted outside said rotating assembly, and/or wherein said frame parts are operated via at least one electronic controller mounted outside said rotating assembly.

18. The wafer flipping device of claim 17, wherein said at least one electronic controller is connected to power said alignment pins or said frame parts.

19. The wafer flipping device of claim 18, wherein said alignment pins or said frame parts are powered via a slip-ring.

20. The wafer flipping device of claim 12, wherein said retractable pins are provided in pairs, and at least one of each pair of said alignment pins comprises an alignment pin.

21. The wafer flipping device of claim 12, comprising a pneumatic distribution system for distributing pneumatic fluid from said rotary valve to respective ones of said gripper frame parts.

22. The wafer flipping device of claim 12, wherein said second orientation is rotated by a hundred and eighty degrees from said first orientation.

23. The wafer flipping device of claim 12, wherein the semiconductor work product is a wafer or a ring.

* * * * *